US009705175B2

(12) United States Patent
Shahramian et al.

(10) Patent No.: US 9,705,175 B2
(45) Date of Patent: Jul. 11, 2017

(54) WAVEGUIDE POWER DIVIDERS

(71) Applicant: Alcatel-Lucent USA Inc., Murray Hill, NJ (US)

(72) Inventors: Shahriar Shahramian, Chatham, NJ (US); Yves Baeyens, Stirling, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 3 days.

(21) Appl. No.: 14/796,550

(22) Filed: Jul. 10, 2015

(65) Prior Publication Data

US 2016/0329621 A1    Nov. 10, 2016

Related U.S. Application Data

(60) Provisional application No. 62/159,081, filed on May 8, 2015.

(51) Int. Cl.
*H01P 5/12* (2006.01)
*H01P 5/16* (2006.01)
*H03F 3/24* (2006.01)
*H03F 3/60* (2006.01)

(52) U.S. Cl.
CPC ............... *H01P 5/16* (2013.01); *H03F 3/245* (2013.01); *H03F 3/602* (2013.01); *H03F 2200/451* (2013.01)

(58) Field of Classification Search
CPC .......... H04L 12/2838; H01P 5/18; H03F 3/21; H03H 7/01
USPC .......................... 333/120, 126, 129, 136, 137
See application file for complete search history.

(56) References Cited

U.S. PATENT DOCUMENTS 8,350,641 B2 *  1/2013  Alkan ................. H04L 12/2838
                                                      333/126
8,422,122 B2 *  4/2013  Tchaplia .................. H01P 5/12
                                                      333/121

OTHER PUBLICATIONS

Banu, S. et al., "Implementation and Performance Analysis of N-Way Wilkinson Power Divider", Consumer Electronics Times, www.cet-journal.org, World Academic Publishing, vol. 1, Issue 1, Apr. 2012, pp. 23-26.
Zhang, H. et al., "Compact Wideband Gysel Power Divider wsith Arbitrary Power Division Based on Patch Type Structure", Progress in Electromagnetics Research, vol. 119, 2011, pp. 395-406.
Salimi, Puria et al., "Broadband Asymmetrical Multi-Section Coupled Line Wilkinson Power Divider With Unequal Power Dividing Ratio", Progress in Electromagnetics Research C, vol. 43, 2013, pp. 217-229.
Stiles, J., https://www.ittc.ku.edu/~jstiles/723/handouts/, Chapters 4 and 7, Published 2009, 68 pages.

(Continued)

*Primary Examiner* — Robert Pascal
*Assistant Examiner* — Kimberly Glenn
(74) *Attorney, Agent, or Firm* — John F. McCabe

(57) ABSTRACT

An apparatus includes a 1×2 waveguide-based power divider. The 1×2 waveguide-based power divider includes a 1×2 waveguide coupler, two primary transmission lines, two three-port waveguide couplers, and a series. The series includes one or more secondary transmission lines. Each primary transmission line connects a corresponding output of the 1×2 waveguide coupler to a first port of a corresponding one of the three-port waveguide couplers. The series connects a second ports of the three-port waveguide couplers.

17 Claims, 5 Drawing Sheets

(56) References Cited

OTHER PUBLICATIONS

"Wilkinson Power Divider Splitter Combiner", http://www.radio-electronics.com/info/rf-technology-design/coupler-combiner-splitter/wilkinson-splitter-combiner-divider.php, Sep. 15, 2014, 3 pgs.
Pozar, David M., Microwave Engineering, Fourth Edition, John Wiley & Sons, Inc., 2012, pp. iii-xvii and pp. 48-94.
Pozar, David M., Microwave Engineering, Fourth Edition, John Wiley & Sons, Inc., 2012, Chapter 3, 70 pgs.
Pozar, David M., Microwave Engineering, Fourth Edition, John Wiley & Sons, Inc., 2012, Chapter 4, 63 pgs.
Pozar, David M., Microwave Engineering, Fourth Edition, John Wiley & Sons, Inc., 2012, Chapter 5, 44 pgs.
Pozar, David M., Microwave Engineering, Fourth Edition, John Wiley & Sons, Inc., 2012, Chapter 6, 45 pgs.
Pozar, David M., Microwave Engineering, Fourth Edition, John Wiley & Sons, Inc., 2012, Chapter 7, 63 pgs.

\* cited by examiner (PRIOR ART)

30

50

WAVEGUIDE POWER DIVIDERS

This application claims the benefit of U.S. provisional application No. 62/159,081, which was filed on May 8, 2015.

BACKGROUND

Technical Field

The inventions relate to microwave and millimeter waveguide devices and methods and devices that use such waveguide devices.

Related Art

This section introduces aspects that may be help to facilitate a better understanding of the inventions. Accordingly, the statements of this section are to be read in this light and are not to be understood as admissions about what is prior art or what is not prior art.

In electronic systems, a variety of multi-port waveguide devices are known. One such multi-port waveguide device is the Wilkinson power divider.

FIG. 1 schematically illustrates a symmetric type of Wilkinson power splitter $10\_w$. The Wilkinson power splitter $10\_w$ includes a 1×2 waveguide coupler $12\_w$ and first and second internal waveguides $14\_w$, $16\_w$. The 1×2 waveguide coupler $12\_w$ divides the power of the signal received via input waveguide $2\_w$ equally between two output ports. The first end of each internal waveguide $14\_w$, $16\_w$ end-connects to a corresponding one of the output ports of the 1×2 waveguide coupler $12\_w$. The second end of each internal waveguide $14\_w$, $16\_w$ forms an output of the Wilkinson power divider, e.g., which may end-connect to an output waveguide $4\_w$, $6\_w$. Each internal waveguide $14\_w$, $16\_w$ has a length configured to accommodate half of the wavelength of electromagnetic signals at the frequency that the Wilkinson power splitter $10\_w$ is desired to provide power splitting. In configurations where the Wilkinson power divider $10\_w$ is a planar device, the labeled elements $2\_w$, $4\_w$, $6\_w$, $12\_w$, $14\_w$, $16\_w$ of FIG. 1 may be, e.g., the metal traces of microwave stripline or microstrip waveguides.

The Wilkinson power divider $10\_w$ also includes a lumped ohmic shunt $28\_w$ that connects the second or output ends of the internal waveguides $14\_w$, $16\_w$. For example, the lumped ohmic shunt $28\_w$ electrically and physically connects the ends of the metal traces of the striplines or microstrips in microwave stripline or microstrip forms of the internal waveguides $14\_w$, $16\_w$. The lumped ohmic shunt 28 is small compared to the wavelength of the electromagnetic signals that the Wilkinson power divider $10\_w$ is configured to power divide.

Over a narrow frequency range, a Wilkinson power divider can efficiently power split a received electromagnetic signal. For example, the Wilkinson power divider $10\_w$ of FIG. 1 may split an electromagnetic signal such that each output waveguide $4\_w$, $6\_w$ receives about half of the power of a microwave electromagnetic signal received from the input waveguide $2\_w$. A Wilkinson power divider also has the advantage of isolating waveguides or devices connected to the output ports thereof. For example, the Wilkinson power divider $10\_w$ of FIG. 1 may be configured to strongly isolate the two output waveguides $4\_w$, $6\_w$ from each other. For appropriate matching, a Wilkinson power divider is a low loss 3-port waveguide device for power splitting a received electromagnetic signal in a narrow frequency range.

SUMMARY OF ILLUSTRATIVE EMBODIMENTS

Whereas a Wilkinson power divider may be a useful waveguide device, such a waveguide device can have some deficiencies. First, the output ports of a conventional Wilkinson power divider are typically located close together due to the inclusion of the lumped ohmic shunt. Such close locations of the output ports may be inconvenient in applications where a power divider is desired for connecting to output devices that are far apart on a substrate. Second, a Wilkinson power divider can transmit electromagnetic signals in frequency ranges outside of the narrow range over which power splitting is desired. Indeed, electromagnetic signals of such other frequency ranges may be common signal contaminants, and transmission of such signal contaminants may be undesirable. One or both of these deficiencies may be less present in some embodiments of waveguide-based power dividers herein. Also, some such embodiments may still have advantages of a conventional Wilkinson power divider, e.g., low loss and electrical isolation of output ports in a desired frequency range.

Embodiments of an apparatus include a 1×2 waveguide-based power divider. The 1×2 waveguide-based power divider includes a 1×2 waveguide coupler, two primary transmission lines, two three-port waveguide couplers, and a series. The series includes one or more secondary transmission lines. Each of the primary transmission lines connects a corresponding output of the 1×2 waveguide coupler to a first port of a corresponding one of the three-port waveguide couplers. The series connects second ports of the three-port waveguide couplers.

In some embodiments of the above apparatus, the series may include first and second of the secondary transmission lines. The first and second of the secondary transmission lines are end-connected by a lumped resistive shunt.

In some embodiments of any of the above apparatus, the power divider may be a symmetric planar waveguide circuit.

In some embodiments of the above apparatus, the power divider may be a planar waveguide circuit, and the two three-port waveguide couplers may be physically located farther apart than a distance between the 1×2 waveguide coupler and one of the two three-port waveguide couplers.

In some embodiments of any of the above apparatus, the two primary transmission lines may have substantially the same length.

In some embodiments of any of the above apparatus, the one or more secondary transmission lines of the series may have a combined path length greater than a path length of one of the primary transmission lines. In some such embodiments, the two primary transmission lines may have substantially the same path length. In some embodiments of this paragraph, the combined path length may be about two times the path length of the one of the primary transmission lines. In some embodiments of this paragraph, the power divider may be a symmetric planar waveguide circuit.

Some embodiments of the above apparatus may further include a frequency multiplier connected to transmit an electromagnetic signal, at an integral multiple of a frequency of a received carrier, to one or more ports of the 1×2 waveguide-based power divider. In such embodiments, the 1×2 waveguide-based power divider may have a passband that blocks signals at the frequency of the received carrier and passes signals at the integral multiple of the frequency of the received carrier. In some embodiments of this paragraph, the series may include one or more secondary transmission lines whose combined path length is greater than a path length of one of the primary transmission lines. In some embodiments of this paragraph, the combined path length may be about two times the path length of one of the primary transmission lines. In some embodiments of this paragraph, the 1×2 waveguide-based power divider may be a symmetric planar waveguide circuit, and the two three-port waveguide couplers may be physically located farther apart than a distance between the 1×2 waveguide coupler and one of the three-port waveguide couplers.

In some embodiments, above apparatus may further include a 2×1 waveguide coupler and two amplifiers. In such embodiments, each of the amplifiers is connected between a corresponding input port of the 2×1 waveguide coupler and a corresponding output port of the 1×2 waveguide-based power divider. In some embodiments of this paragraph, the apparatus may further include a wireless transmitter including the 2×1 waveguide coupler, the two amplifiers, and the 1×2 waveguide-based power divider. In some embodiments of this paragraph, the apparatus may further include a wireless receiver including the 2×1 waveguide coupler, the two amplifiers, and the 1×2 waveguide-based power divider. In some embodiments of this paragraph, the series may include one or more secondary transmission lines whose combined path length is greater than a path length of one of the primary transmission lines. In some embodiments of this paragraph, the 1×2 waveguide-based power divider may be a symmetric planar waveguide circuit, and the two three-port waveguide couplers may be physically located farther apart than a distance between the 1×2 waveguide coupler and one of or either of the two three-port waveguide couplers.

DETAILED DESCRIPTION OF ILLUSTRATIVE EMBODIMENTS

The Detailed Description of the Illustrative Embodiments and the drawings illustrate principles and examples within the scope of the claims. From this specification, persons of ordinary skill in the relevant arts would be able to devise other embodiments, which are not explicitly described herein. The claims of this application are intended to also cover such embodiments and should not be construed to be limited to the illustrative embodiments.

Herein, a transmission line refers to a waveguide for transmitting electromagnetic signals at microwave and/or millimeter-wave frequencies. A transmission line includes one or more electrical conductors that extend along a propagation direction of electromagnetic signals on the transmission line. For carrying electromagnetic signals, a transmission line often has a region of approximately constant cross section along the propagation direction. Also, a transmission line is typically characterized by an impedance, i.e., per unit length, and a total length. Herein, a transmission line may be straight, curved, bent, or a combination of these forms.

Herein, a transmission line may be a conventional waveguide suitable for transmitting electromagnetic signals at microwave and/or millimeter-wave frequencies. For example, a transmission line may be a coaxial cable; a rectangular, circular, or elliptical cross-section waveguide; a stripline waveguide; or a microstrip waveguide. A transmission line or waveguide may include an empty volume between or inside one or more electrical conductors of the transmission line or waveguide and/or may include one or more dielectrics between, inside, adjacent to, and/or adjacent and around the electrical conductor(s).

Herein, a recitation that a device has N input port(s) and/or M output port(s) is open language. In particular, a recitation that a device has N input ports means that the device has N or more input ports, and recitation that a device has M output ports means that the device has M or more output ports. Similarly, describing a device as an R×S device means that the device has, at least, R input port(s) and has, at least, S output port(s).

In various embodiments, an input port of a device may be connected to function as an input or as an output and an output port of a device may be connected to function as an input or an output.

Figure 2:
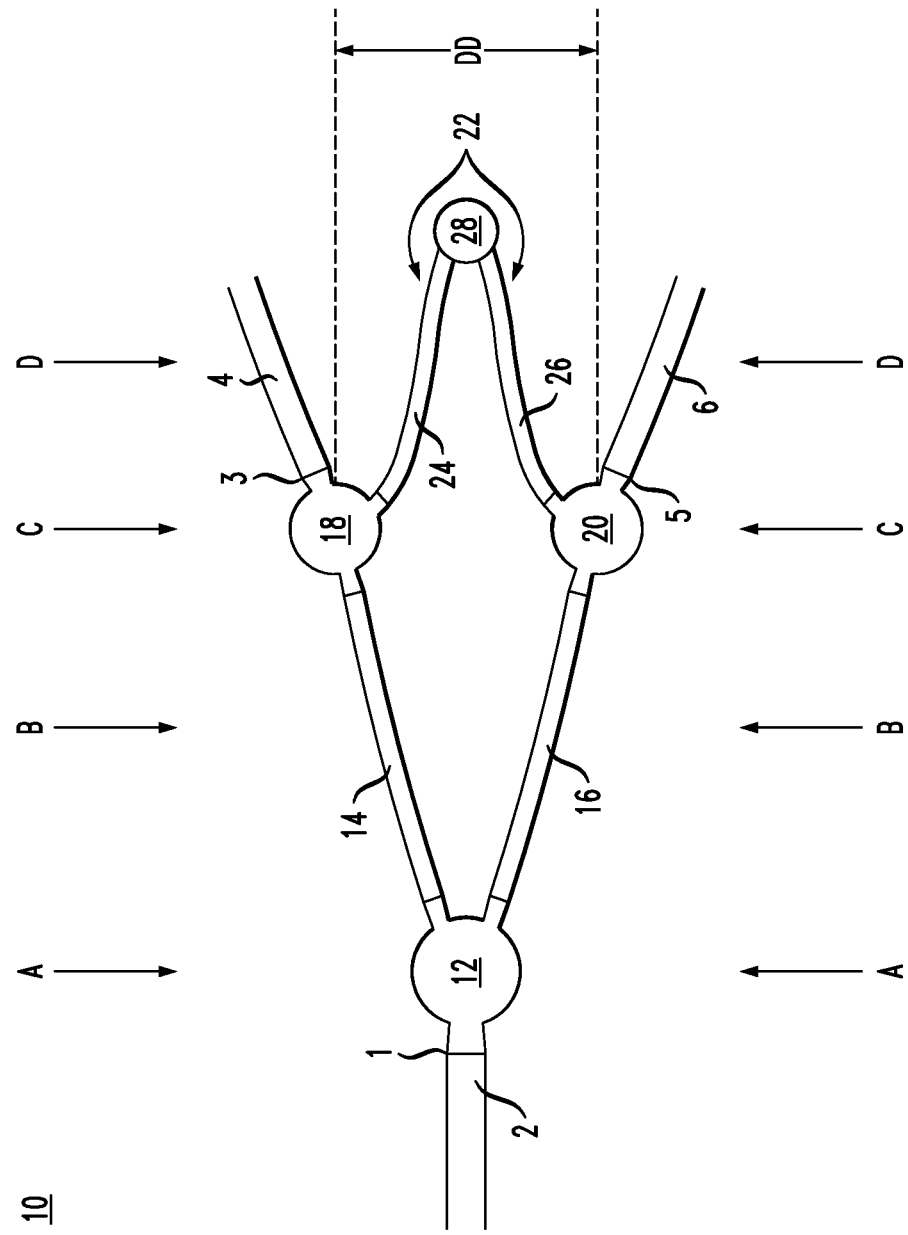
FIG. 2 is a block or circuit diagram schematically illustrating an embodiment of a microwave or millimeter-wave 1×2 waveguide-based power divider.
Figure 3A:
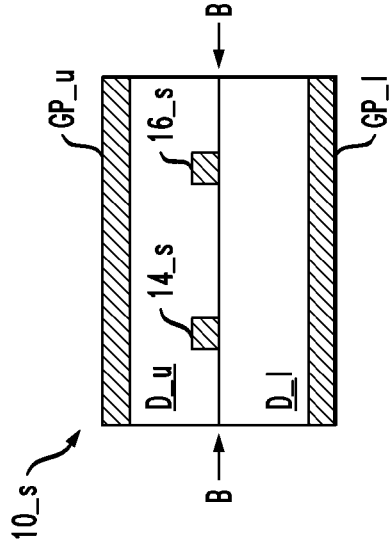
FIGS. 3a, 3b, 3c, and 3d are cross sectional views of a stripline embodiment of the 1×2 waveguide-based power divider of FIG. 2 along slices AA, BB, CC, and DD in FIG. 2.
Figure 3B:
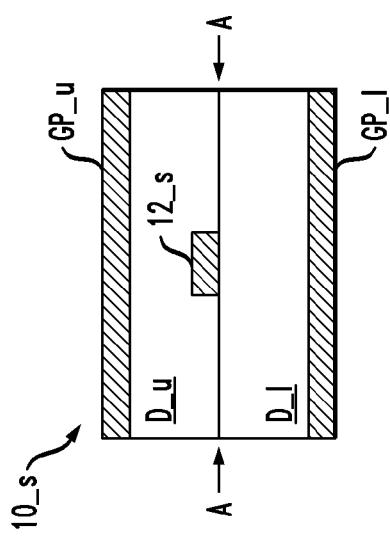
Figure 3C:
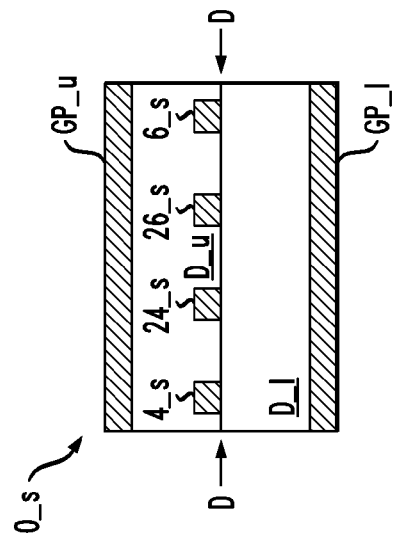
Figure 3D:
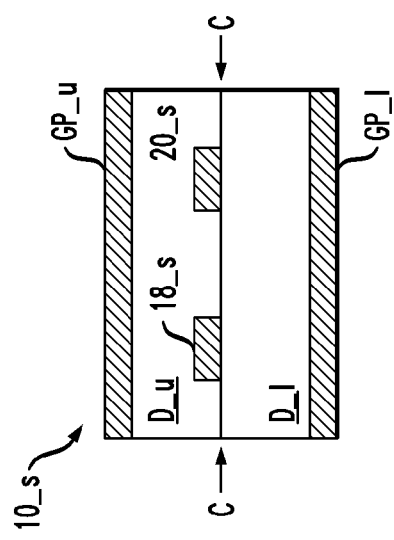
Figure 4A:
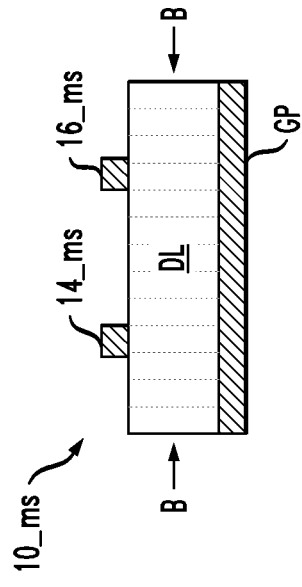
FIGS. 4a, 4b, 4c, and 4d are cross sectional views of a microstrip embodiment of the 1×2 waveguide-based power divider of FIG. 2 along slices AA, BB, CC, and DD in FIG. 2.
Figure 4B:
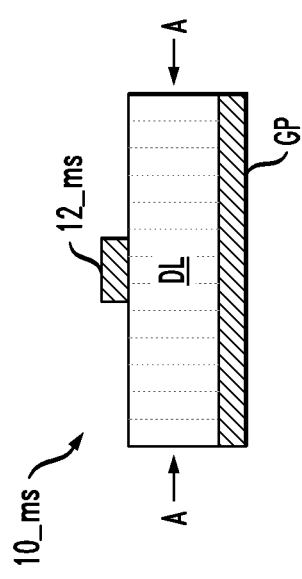
Figure 4C:
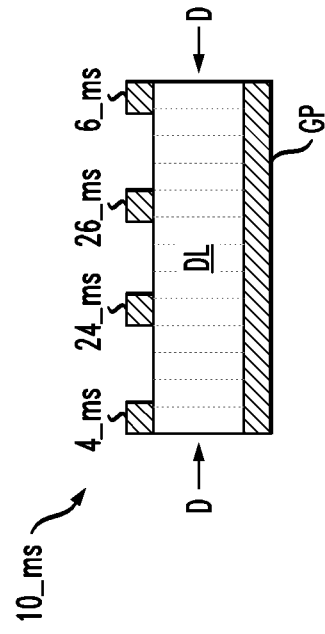
Figure 4D:
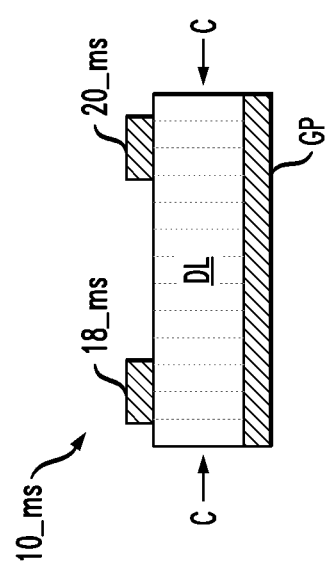

FIG. 2 schematically illustrates a 1×2 waveguide-based power divider 10, which is configured to divide an input electromagnetic signal in a preset frequency range.

The 1×2 waveguide-based power divider 10 has an input port 1 and two output ports 3, 5. The input port 1 is configured to end-connect to an input transmission line 2, and the first and second output ports 3, 5 are configured to end-connect to respective first and second output transmission lines 4, 6 or other output devices. In some embodiments, the input and output transmission lines 2, 4, 6 may have about the same impedance Z.

The 1×2 waveguide-based power divider 10 includes a 1×2 waveguide coupler 12; first and second primary internal transmission lines 14, 16; first and second three-port waveguide couplers 18, 20; and a physical series 22 of one or more waveguide elements. The input port of the 1×2 waveguide coupler 12 is the input port 1 of the 1×2 waveguide-based power divider 10. The first primary internal transmission line 14 connects a first output port of the 1×2 waveguide coupler 12 to an input port of the first three-port waveguide coupler 18. The second primary internal transmission line 16 connects a second output port of the 1×2 waveguide coupler 12 to an input port of the second three-port waveguide coupler 20. Two output ports of the three-port waveguide couplers 18, 20 are the two output ports 3, 5 of the 1×2 waveguide-based power divider 10. A remaining output port of the first three-port waveguide coupler 18 is connected by the series 22 of one or more waveguide elements to a remaining output port of the second three-port waveguide coupler 20.

In the 1×2 waveguide-based power divider 10, the three waveguide couplers 12, 18, 20 may be, e.g., T-junction power dividers for conventional waveguides or other power dividers, e.g., small 1×2 couplers for waveguide ends.

In the 1×2 waveguide-based power divider 10, the series 22 of waveguide elements may include first and second secondary internal transmission lines 24, 26, which are serially end-connected by a lumped electrical shunt 28. In a stripline embodiment, the lumped electrical shunt 28 end-connects the conducting traces of the two secondary internal transmission lines 24, 26. In such an embodiment, the two secondary transmission lines 24, 26 may share a pair of or have edge-connected pairs of ground planes. In a microstrip embodiment, the lumped electrical shunt 28 end-connects the conducting traces of the two secondary internal transmission lines 24, 26. In such an embodiment, the two secondary transmission lines 24, 26 may share a ground plane or have edge-connected ground planes. In a coaxial cable embodiment, the lumped electrical shunt 28 end-connects the coaxial conductors of the secondary internal transmission lines 24, 26. In such an embodiment, the two secondary transmission lines 24, 26 may have grounding sheaths that are shorted together.

FIGS. 3a, 3b, 3c, and 3d illustrate cross sections of a first planar embodiment 10_s of the power splitter 10 of FIG. 2 at respective slices A-A, B-B, C-C, and D-D therein. In the first planar embodiment 10_s, the 1×2 waveguide coupler 12 of FIG. 2 has a metal trace 12_s; the primary internal transmission lines 14, 16 of FIG. 2 have metal traces 14_s, 16_s; the three-port waveguide couplers 18, 20 of FIG. 2 have metal traces 18_s, 20_s; the secondary internal transmission lines 24, 26 of FIG. 2 have metal traces 24_s, 26_s; and the output waveguides 4, 6 of FIG. 2 have metal traces 4_s, 6_s. In the first planar embodiment 10_s, these metal traces 12_s, 14_s, 16_s, 18_s, 20_s, 24_s, 26_s, 4_s, 6_s are located between an upper dielectric layer D_u and a lower dielectric layer D_l, e.g., at an interface between the two dielectric layers D_u, D_l. The two dielectric layers D_u, D_l may or may not have the same dielectric constant. The first planar embodiment 10_s also includes upper and lower ground planes G_u, G_l along outer surfaces of the stack formed by the upper and lower dielectric layers D_u, D_l.

FIGS. 4a, 4b, 4c, and 4d illustrate cross sections of a second planar embodiment 10_ms of the power splitter 10 of FIG. 2 at respective slices A-A, B-B, C-C, and D-D. In the second planar embodiment 10_ms, the 1×2 waveguide coupler 12 of FIG. 2 has a metal trace 12_ms; the primary internal transmission lines 14, 16 of FIG. 2 have metal traces 14_ms, 16_ms; the three-port waveguide couplers 18, 20 of FIG. 2 have metal traces 18_ms, 20_ms; the secondary internal transmission lines 24, 26 of FIG. 2 have metal traces 24_ms, 26_ms; and the output waveguides 4, 6 have metal traces 4_ms, 6_ms. In the second planar embodiment 10_ms, the metal traces 12_ms, 14_ms, 16_ms, 18_ms, 20_ms, 24_ms, 26_ms, 4_ms, 6_ms are located along one surface of a dielectric layer DL. The second planar embodiment 10_ms also includes a ground plane GP along an opposite surface of the dielectric layer DL.

Some embodiments of the 1×2 waveguide-based power divider 10 of FIG. 2 may offer advantages over conventional Wilkinson power dividers as discussed below.

First, due to the secondary internal transmission lines 24, 26, the two output ports 3, 5 may be located at a substantial physical distance DD from each other. The physical distance DD can be about as large as the sum of the lengths of the secondary internal transmission lines 24, 26. For example, the distance D may be greater than or equal to a significant fraction of the wavelength of electromagnetic signals, which the 1×2 waveguide-based power divider 10 is configured to power divide. For example, D may be greater than ½ of said wavelength or may be greater than the distance between the 1×2 waveguide coupler 12 and one or both of the three-port waveguide couplers 18, 20.

Thus, such embodiments of the 1×2 waveguide-based power divider 10 may directly physically connect to nearby output devices, wherein the output devices are physically separated by large distances. Since the output ports of a typical Wilkinson power divider are physically close together, the 1×2 waveguide-based power divider 10 may be more useful than a Wilkinson power divider for connecting such physically distant output devices, e.g., to directly physically connect at the two output ports 3, 5 rather than to connect to the output ports 3, 5 via intermediary waveguides.

Second, due to the series 22 of FIG. 2, some embodiments of the 1×2 waveguide-based power divider 10 may strongly attenuate or block input electromagnetic signals in one or more preset other frequency ranges, e.g., undesired frequency range(s). Such an undesired range may cover, e.g., lower frequencies than those of electromagnetic signals that the 1×2 waveguide-based power divider 10 power divides received signals with low loss. For example, the 1×2 waveguide-based power divider 10 may strongly block or attenuate electromagnetic signals at subharmonic(s) of one or more frequencies in a preset narrow passband of the 1×2 waveguide-based power divider 10.

As an example, the series 22 may be configured to approximately accommodate K/2 wavelengths of electromagnetic signals at a subharmonic of a frequency in a preset passband of the 1×2 waveguide-based power divider 10. Here, K is an odd positive integer. The subharmonic may be, e.g., ½, ⅓, or ¼ of a frequency in the preset passband of the 1×2 waveguide-based power divider 10. For electromagnetic signals at such a subharmonic, the series 22 can cause destructive interference, at the three-port waveguide couplers 18, 20, between electromagnetic signals traveling via the two primary internal transmission lines 14, 16. Such destructive interference can reduce transmission of such electromagnetic signals from the input port 1 to the output ports 3, 5 of the 1×2 waveguide-based power divider 10.

Third, some such embodiments of the 1×2 waveguide-based power divider 10 may operate as improved versions of conventional Wilkinson power splitters. For example, the series 22 may electrically isolate the output ports 3, 5 from each other over a preset passband of the 1×2 waveguide-based power divider 10.

Referring again to FIG. 2, some embodiments of the 1×2 waveguide-based power divider 10 have approximate bilateral symmetry.

Figure 1:
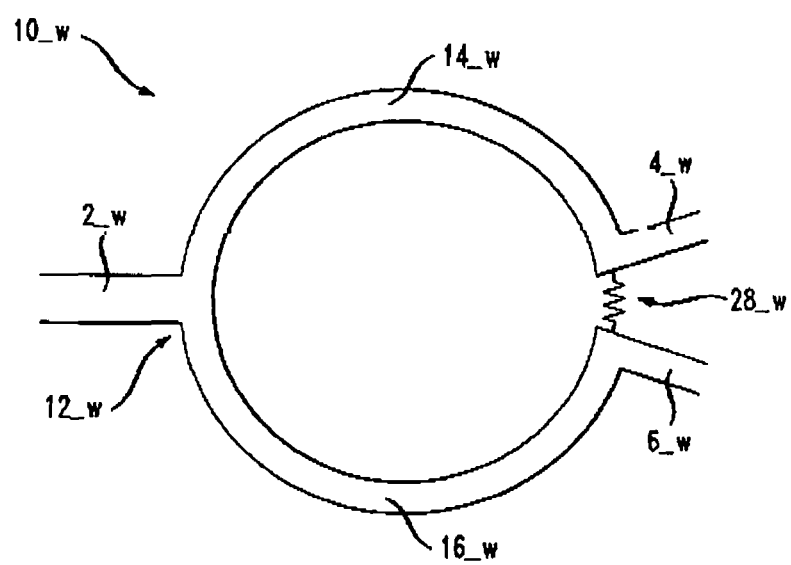
FIG. 1 is a block or circuit diagram schematically illustrating a symmetric type of Wilkinson power splitter.

In symmetric embodiments, the primary internal transmission lines 14, 16 have about the same length L'. The length L' may be set, e.g., so that the primary internal transmission lines 14, 16 operate approximately as ¼-wavelength transmission lines in the passband of the 1×2 waveguide-based power divider 10. Due to typical variations or fabrication errors, the primary internal transmission lines 14, 16 may operate as (¼±Δ) wavelength transmission lines. Here, the percentage length error Δ may be as large as a common percentage deviation of the internal transmission lines 14_w, 16_w of the conventional Wilkinson power splitter 10_w of FIG. 1 from ¼-wavelength transmission lines. For example, the percentage length error Δ may be 10% or less or 5% or less.

In such symmetric embodiments, the two primary internal transmission lines 14, 16 also have about the same first impedance Z'. The impedance Z' may be, e.g., about $(2)^{0.5}Z$, where Z is the impedance of the input and output waveguides 2, 4, 6. Again, typically variations or fabrication errors may cause the impedances of the primary internal transmission lines 14, 16 to vary from $(2)^{0.5}Z$ by percentage amounts common for the internal transmission lines 14_w, 16_w of the conventional Wilkinson power splitter 10_w of FIG. 1 to vary from $(2)^{0.5}Z$.

In such symmetric embodiments, the two secondary internal transmission lines 24, 26 may also have about the same second length L" and may have about the same second impedance Z". The second length L" of the secondary internal transmission lines 24, 26 may be about the same as or may differ from the first length L' of the primary internal transmission lines 14, 16 as already explained.

In such symmetric embodiments, the 1×2 waveguide coupler 12 may be an approximately equal power divider, e.g., a 3 dB (decibel) divider, and the two three-port waveguide couplers 18, 20 may transmit about the same power to the nearby output ports 3, 5. The individual three-port waveguide couplers 18, 20 may or may not be approximately equal-power dividers, e.g., they may be symmetric 3 dB power dividers.

In such symmetric embodiments, the lumped electrical shunt 28 may or may not have an impedance of about 2Z where Z is the impedance of the input and/or output waveguides 2, 4, 6. That is, the lumped electrical shunt 28 may or may not have an impedance common for the lumped ohmic shunt 28_w of the conventional Wilkinson power splitter 10_w of FIG. 1.

Figure 5:
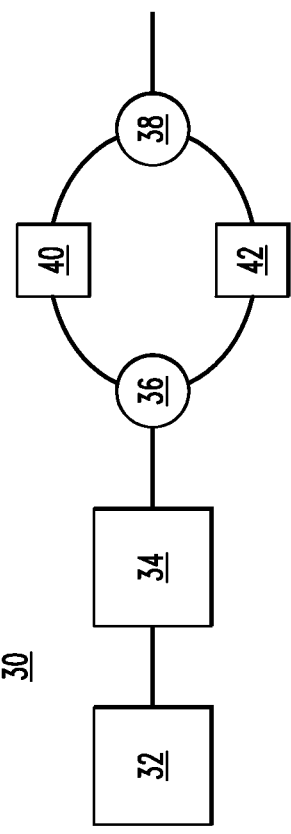
FIG. 5 is a block diagram of a waveguide circuit that includes an embodiment of the power splitter of FIG. 2.

FIG. 5 illustrates a waveguide circuit 30, which is based on transmission lines and includes the 1×2 waveguide-based power divider 10 of FIG. 2.

The waveguide circuit 30 includes a signal generator or source 32; a frequency multiplier 34; a back-to-back pair of 1×2 waveguide couplers 36, 38; and a pair of analog signal processors 40, 42.

The signal generator or source 32 outputs to the frequency multiplier 34 an electromagnetic signal having a first frequency. The outputted electromagnetic signal may, e.g., an unmodulated carrier wave at a microwave frequency or a millimeter frequency. The first frequency is typically a low frequency where conventional electronics can produce an electromagnetic signal with a stable frequency.

The frequency multiplier 34 outputs an electromagnetic signal primarily at a frequency that is an integer multiple of the first frequency of the electromagnetic signal from the signal generator or source 32. As examples, the integer multiple of the first frequency may be 2, 3, or 4 so that the frequency multiplier 34 is a frequency doubler, tripler, or quadrupler. The frequency multiplier 34 may be a conventional frequency multiplier capable of producing an output electromagnetic signal at a suitable frequency. Such a conventional frequency multiplier typically produces a signal that is contaminated by one or more subharmonics of the selected integer multiple of the first frequency. For example, the frequency multiplier 34 may output an electromagnetic signal contaminated with the electromagnetic signal of the first frequency, which is produced by the signal generator or source 32.

The 1×2 waveguide splitters 36, 38 of the pair are connected together in a back-to-back structure so that the input port of the back-to-back structure is connected directly to a nearby output of the frequency multiplier 34 and the output port back-to-back structure is an output of the waveguide circuit 30. In the back-to-back structure, the two output ports of one of the 1×2 waveguide couplers 36 are connected, in a one-to-one manner, to two output ports of the other of the 1×2 waveguide couplers 38.

In the pair of 1×2 waveguide splitters 36, 38, at least, one of the 1×2 waveguide couplers 36, 38, i.e., either the 1×2 waveguide coupler 36 or the 1×2 waveguide coupler 38, is an embodiment of the 1×2 waveguide-based power divider 10 of FIG. 2. The other of the 1×2 waveguide couplers 38, 36 of the pair may be an embodiment of the 1×2 waveguide-based power divider 10 of FIG. 2 or may be a conventional three-port waveguide coupler, e.g., a conventional Wilkinson power divider or a simpler 3 dB symmetric power divider. Since, at least, one of the 1×2 waveguide couplers 36, 38 is an embodiment of the 1×2 waveguide-based power divider 10 of FIG. 2, the back-to-back structure may be configured to filter out electromagnetic signals at undesirable frequencies, e.g., at or near the above-described preset subharmonic(s) of the frequency primarily output by the frequency multiplier 34. As an example, the back-to-back structure may, e.g., function as a passband filter that attenuates or blocks electromagnetic signals at the frequency of the signal generator or source 32.

Each of the analog processors 40, 42 performs an analog operation on the portion of the electromagnetic signal received from the 1×2 waveguide coupler 36. For example, each analog processor 40, 42 may include or be an amplifier, an attenuator, and/or a filter. Thus, the parallel pair of analog processors 40, 42 may enable the separate amplification, attenuation, and/or filtering of two portions of the electromagnetic signal output by the frequency multiplier 36. Such separate processing of portions of the entire electromagnetic signal in the individual analog processors 40, 42 may reduce undesirable nonlinear effects during such processing. For example, such separate processing may enable a more linear processing of the electromagnetic signal from the frequency multiplier 34.

In various embodiments, the waveguide circuit 30 of FIG. 5 may be used in a transmitter or a receiver. For example, the output of the waveguide circuit 30 may be a local oscillator signal for a coherent wireless or optical receiver or may be a carrier source for a wireless or optical transmitter.

Figure 6:
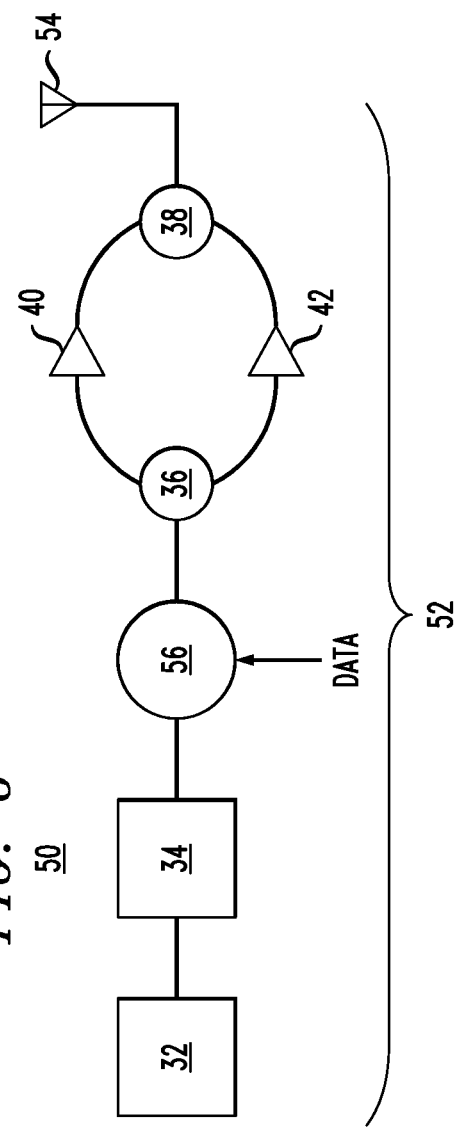
FIG. 6 is a block diagram for a wireless transmitter that includes the waveguide circuit of FIG. 5.

FIG. 6 illustrates a wireless transmitter 50 that is based on the waveguide circuit 30 of FIG. 5. The transmitter 50 includes an electrical driver 52 and an antenna 54. The antenna 54 is connected to be driven by the electromagnetic signal produced by the electrical driver 52.

The electrical driver 52 includes the waveguide circuit 30 of FIG. 5 and a data modulator 56. The data modulator 56 modulates a digital data stream (DATA) onto the electromagnetic signal produced by the frequency multiplier 34. The waveguide circuit 30 also provides analog processing of the electromagnetic signal from the frequency multiplier 34, e.g., to cause amplification, attenuation, and/or filtering. In the waveguide circuit 30, the use of the back-to-back structure 36, 38, 40, 42 may enable, e.g., more linear processing of the electromagnetic signal from the frequency multiplier 34.

Whereas the data modulator 56 of FIG. 6 is located to modulate an electromagnetic signal prior to processing of the electromagnetic signal by the back-to-back structure 36, 38, 40, 42, other embodiments may position the data modulator 56 differently with respect to the back-to-back structure 36, 38, 40, 42. For example, some embodiments of a wireless transmitter (not shown) may position the data modulator 56 between the back-to-back structure 36, 38, 40, 42 and the antenna 54 of FIG. 6.

In above-described FIGS. 5 and 6, single lines indicate connections between ports of devices. Said lines may be formed by nearby physical connections of said ports and/or may be formed indirectly via connecting transmission lines.

The Detailed Description of the Illustrative Embodiments and the Drawings merely illustrate the principles of the invention. It will thus be appreciated that those skilled in the art will be able to devise various arrangements that, although not explicitly described or shown herein, embody the principles of the inventions and are included within the claimed inventions. Furthermore, all examples recited herein are principally intended to be only for pedagogical purposes to aid in understanding the principles of the inventions and concepts contributed by the inventor to furthering the art, and are to be construed as being without limitation to such specifically recited examples and conditions. Moreover, all statements herein reciting principles, aspects, and embodiments of the inventions, as well as specific examples thereof, are intended to encompass equivalents thereof.

What is claimed is:

1. An apparatus, comprising:
    a 1×2 waveguide-based power divider comprising a 1×2 waveguide coupler, two primary transmission lines, two three-port waveguide couplers, and a series, the series including one or more secondary transmission lines; and
    wherein each of the primary transmission lines connects a corresponding output port of the 1×2 waveguide coupler to a first port of a corresponding one of the three-port waveguide couplers; and
    wherein the series connects second ports of the three-port waveguide couplers; and
    wherein the series includes first and second of the secondary transmission lines, the first and second of the secondary transmission lines being end-connected by a lumped resistive shunt.

2. The apparatus of claim 1, wherein the power divider is a symmetric planar waveguide circuit.

3. The apparatus of claim 1, wherein the two primary transmission lines have substantially the same length.

4. An apparatus, comprising:
    a 1×2 waveguide-based divider comprising a 1×2 waveguide coupler, two primary transmission lines, two three-port waveguide couplers, and a series, the series including one or more secondary transmission lines; and
    wherein each of the primary transmission lines connects a corresponding output port of the 1×2 waveguide coupler to a first of a corresponding one of the three-port waveguide couplers;
    wherein the series connects second ports of the three-port waveguide couplers; and
    wherein the power divider is a planar waveguide circuit and the two three-port waveguide couplers are physically located farther apart than a distance between the 1×2 waveguide coupler and one of the two three-port waveguide couplers.

5. An apparatus, comprising:
    a 1×2 waveguide-based power divider comprising a 1×7 waveguide coupler, two primary transmission lines, two three-port waveguide couplers, and a series, the series including one or more secondary transmission lines; and
    wherein each of the primary transmission lines connects a corresponding output port of the 1×2 waveguide coupler to a first port of a corresponding one of the three-port waveguide couplers;
    wherein the series connects second ports of the three-port waveguide couplers; and
    wherein the one or more secondary transmission lines of the series have a combined path length greater than a path length of one of the primary transmission lines.

6. The apparatus of claim 5, wherein the two primary transmission lines have substantially the same path length.

7. The apparatus of claim 5, wherein the combined path length is about two times the path length of the one of the primary transmission lines.

8. The apparatus of claim 5, wherein the power divider is a symmetric planar waveguide circuit.

9. An apparatus, comprising:
    a 1×2 waveguide-based power divider comprising a 1×2 waveguide coupler, two primary transmission lines, two three-port waveguide couplers, and a series, the series including one or more secondary transmission line; and
    wherein each of the primary transmission lines connects a corresponding output port of the 1×2 waveguide coupler to a first port of a corresponding one of the three-port waveguide couplers;
    wherein the series connects second ports of the three-port waveguide couplers; and
    wherein the apparatus further comprises a frequency multiplier connected to transmit an electromagnetic signal at an integral multiple of a frequency of a received carrier to one or more ports of the 1×2 waveguide-based power divider, the 1×2 waveguide-based power divider having a passband that blocks signals at the frequency of the received carrier and passes signals at the integral multiple of the frequency of the received carrier.

10. The apparatus of claim 9, the one or more secondary transmission lines of the series having a combined path length greater than a path length of one of the primary transmission lines.

11. The apparatus of claim 10, wherein the combined path length is about two times the path length of one of the primary transmission lines.

12. The apparatus of claim 9, wherein the power divider is a symmetric planar waveguide circuit and the two three-port waveguide couplers are physically located farther apart than a distance between the 1×2 waveguide coupler and one of the three-port waveguide couplers.

13. An apparatus, comprising:
    a 1×2 waveguide-based power divider comprising a 1×2 waveguide coupler, two primary transmission lines, two three-port waveguide couplers, and a series, the series including one or more secondary transmission lines; and
    wherein each of the primary transmission lines connects a corresponding output port of the 1×2 waveguide coupler to a first port of a corresponding one of the three-port waveguide couplers;
    wherein the series connects second ports of the three-port waveguide couplers; and
    further wherein the apparatus further comprises a 2×1 waveguide coupler and two amplifiers, each of the amplifiers being connected between a corresponding input port of the 2×1 waveguide coupler and a corresponding output port of the 1×2 waveguide-based power divider.

14. The apparatus of claim 13, further comprising a wireless transmitter including the 2×1 waveguide coupler, the two amplifiers, and the 1×2 waveguide-based power divider.

15. The apparatus of claim 13, further comprising a frequency multiplier connected to transmit electromagnetic signals into an output port of the 2×1 waveguide coupler or to transmit electromagnetic signals into an input port of the 1×2 waveguide-based power divider.

16. The apparatus of claim 13, the one or more secondary transmission lines of the series having a combined path length greater than a path length of one of the primary transmission lines.

17. The apparatus of claim 13, wherein the power divider is a symmetric planar waveguide circuit and the two three-port waveguide couplers are physically located farther apart than a distance between the 1×2 waveguide coupler and one of the two three-port waveguide couplers.

* * * * *